United States Patent [19]
Gobrecht et al.

[11] Patent Number: 5,153,695
[45] Date of Patent: Oct. 6, 1992

[54] SEMICONDUCTOR GATE-CONTROLLED HIGH-POWER CAPABILITY BIPOLAR DEVICE

[75] Inventors: Jens Gobrecht, Gebenstorf; Horst Grüning, Baden; Jan Voboril, Nussbaumen, all of Switzerland

[73] Assignee: BBC Brown, Boveri AG, Baden, Switzerland

[21] Appl. No.: 581,071

[22] Filed: Sep. 10, 1990

Related U.S. Application Data

[63] Continuation-in-part of Ser. No. 320,919, Mar. 8, 1989, abandoned, which is a continuation of Ser. No. 033,805, Apr. 3, 1987, abandoned.

[30] Foreign Application Priority Data

Apr. 30, 1986 [CH] Switzerland ............... 1775/86-1

[51] Int. Cl.$^5$ .................................. H01L 29/74
[52] U.S. Cl. ........................... 357/38; 357/22; 357/39; 357/52; 357/55; 357/37; 357/36
[58] Field of Search ............ 357/38, 39, 52, 55, 357/22 E, 37, 36

[56] References Cited

U.S. PATENT DOCUMENTS

| | | | |
|---|---|---|---|
| 3,982,264 | 9/1976 | Ishitani | 357/22 E |
| 4,377,816 | 3/1983 | Sittig | 357/39 |
| 4,514,898 | 5/1985 | Przybysz et al. | 357/38 |
| 4,543,706 | 10/1985 | Bencuya et al. | 357/22 E |
| 4,571,815 | 2/1986 | Baliga et al. | 357/22 E |
| 4,596,999 | 6/1986 | Gobrecht et al. | 357/22 |
| 4,673,961 | 6/1987 | Nishizawa et al. | 357/22 E |
| 4,742,382 | 5/1988 | Jaecklin | 357/39 |
| 4,774,560 | 9/1988 | Coe | 357/38 |
| 4,801,554 | 1/1989 | Gobrecht et al. | 357/22 |
| 4,829,348 | 5/1988 | Broich et al. | 357/22 |
| 4,849,800 | 7/1989 | Abbas et al. | 357/38 |

FOREIGN PATENT DOCUMENTS

| | | |
|---|---|---|
| 121068 | 10/1984 | European Pat. Off. . |
| 178387 | 4/1986 | European Pat. Off. . |
| 0303046 | 2/1989 | European Pat. Off. ............. 357/39 |
| 55-91879 | 7/1980 | Japan ............................... 357/22 E |
| 55-134959 | 10/1980 | Japan ............................... 357/22 E |
| 56-46563 | 4/1981 | Japan ............................... 357/22 E |
| 2013030 | 8/1979 | United Kingdom ............. 357/22 E |
| 2071912 | 9/1981 | United Kingdom ............. 357/22 E |

OTHER PUBLICATIONS

D. Kendall, "On Etching Very Narrow Grooves in Silicon", Apply, Phys. Lett., vol. 26 #4, Feb. 15, 1975, pp. 195-197.

*Primary Examiner*—William Mintel
*Assistant Examiner*—Steven Loke
*Attorney, Agent, or Firm*—Oblon, Spivak, McClelland, Maier & Neustadt

[57] ABSTRACT

A gate-turn-off power semiconductor device of the GTO or FCTh type, having a control zone of alternately arranged finely subdivided cathode fingers and gate trenches, wherein the gate trenches are constructed as narrow deep slots, preferably by a crystal-direction-selective wet chemical etching process, while the original substrate surface is retained in the remaining area of the semiconductor substrate. Compared with the conventional "recessed-gate" construction, this quasi-planar construction offers a number of advantages in the electrical behavior, in the integration of auxiliary functions and in the production.

9 Claims, 5 Drawing Sheets

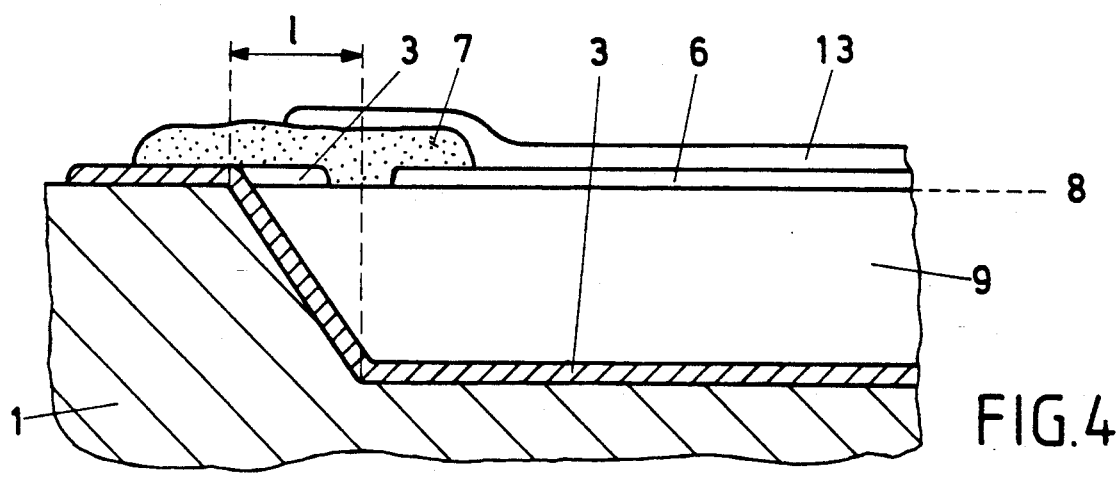
FIG.4
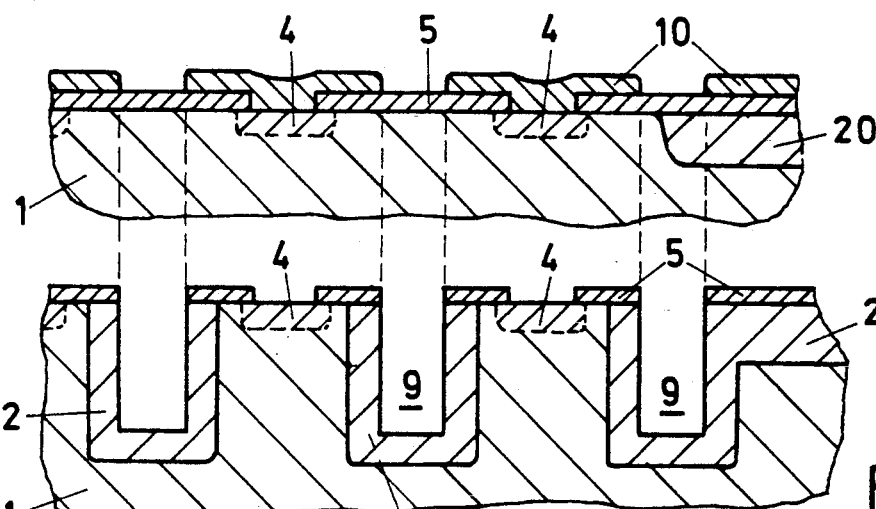
FIG.5A
FIG.5B
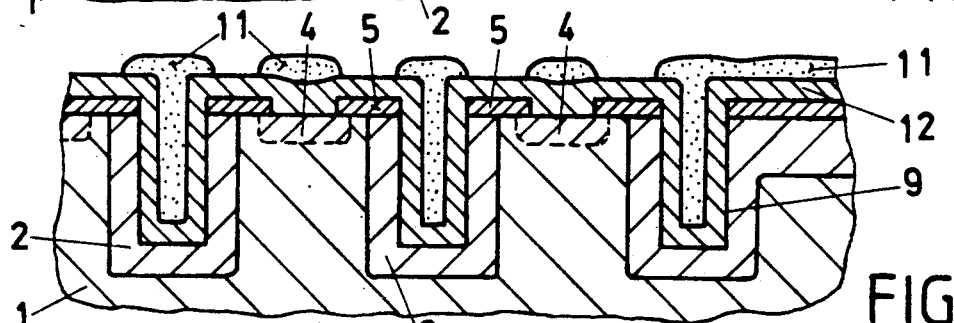
FIG.5C
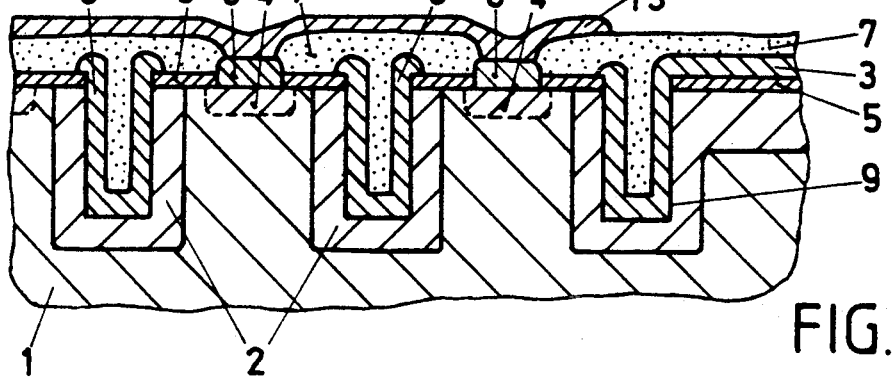
FIG.5D

SEMICONDUCTOR GATE-CONTROLLED HIGH-POWER CAPABILITY BIPOLAR DEVICE

This application is a Continuation-in-Part of application Ser. No. 07/320,919, filed on Mar. 8, 1989, now abandoned, which is a continuation of application Ser. No. 07/033,805, filed on Apr. 3, 1987, which was previously abandoned.

BACKGROUND OF THE INVENTION

1. Field of the Invention

The present invention relates to a semiconductor device, particularly for high power switching of the type known, for example, from European Patent A1-0 121 068.

2. Discussion of Background

Turn-off power semiconductor devices in the form of GTO thyristors (GTO=Gate Turn Off), FCThs (FCTh=Field Controlled Thyristor) or SIThs (SITh=Static Induction Thyristor) are becoming increasingly important in power electronics, particularly in the case of static converters or electric drive systems.

In addition to high current rating in the conduction case and high reverse voltages, the main emphasis in these devices is placed on good controllability, particularly with respect to turning them off via the control electrode or control zone.

For the construction of GTO thyristors and FCThs, to which the further discussions are restricted, a step-shaped so-called "recessed-gate" structure consisting of gate and cathode fingers alternately following each other has been proposed in the printed document initially quoted, in which structure the entire semiconductor substrate outside the remaining cathode fingers is removed except for the lower plane of the gate contact. As can be seen quite clearly in FIG. 1 of this printed document, the lower gate plane in the completed device (GTO or FCTh) forms a new continuous main plane from which the remaining cathode fingers project upwards.

Although the construction of these known devices with "recessed-gate" structure has the advantage of being very easily contacted on the cathode side, this is counteracted by restrictions which have an unfavorable effect particularly with respect to the achievable control behavior, but also during production.

On the one hand, if a trench is used in the edge area outside the control zone given by the cathode fingers in order to achieve a high reverse-voltage rating, a deep selective and thus comparatively complex p-type diffusion must be provided in an additional process step to neutralize the negative influences of the P-N junction emerging at the surface.

On the other hand, the distinctly stepped structure after the deep etching results in problems during all subsequent photolithographic processes since the photoresist distributes itself with greatly differing thickness on the highly structured substrate surface. This leads to problems particularly during the etching of the gate metallization in the gate trenches so that, in practice, only the gate bottom can be metallized so that the electrical separation between gate and cathode contact is achieved with sufficient reliability. For this reason, the trenches must keep within a particular width which, in turn, restricts the achievable thickness of the cathode fingers in the control zone.

SUMMARY OF THE INVENTION

The objects of the present invention are to provide a new and improved semiconductor device which does not have the distinctly stepped structure on the cathode side and, as a result, has a denser arrangement of the cathode fingers and, resulting from that, an improved driving characteristic.

The above objects, and others, are achieved according to the invention providing a novel semiconductor device of the type initially mentioned, including a semiconductor substrate which has a plurality of differently doped layers between an anode and a cathode, and on the cathode side, a control zone, acting as gate, with a plurality of strip-shaped cathode fingers which are separated from each other by gate trenches arranged between the cathode fingers and inserted into the semiconductor substrate; and gate contacts for controlling the component being provided in the gate trenches; wherein the gate trenches are constructed as narrow deep slots which are limited in their extent to the region of the control zone; and wherein the original cathode-side substrate surface of the semiconductor substrate is retained outside the control zone.

The core of the invention consists in the fact that, in a semiconductor device having a finely subdivided control zone which comprises gate and cathode fingers which alternately follow each other, the entire semiconductor substrate is no longer removed by a deep etching process around the cathode fingers down to the lower level of the gate plane but now only the gate trenches are etched from the semiconductor substrate between the cathode fingers in the form of narrow deep slots, the original surface of the semiconductor substrate in the remaining region however being retained, particularly in the edge areas around the control zone.

Thus, the semiconductor device according to the invention no longer has a step-structured cathode-side surface but essentially has a planar surface (apart from the gate trench slots).

Due to this planarity, the required subsequent photolithographic processes can be carried uut with greater fineness which leads to narrower gate trenches, a greater cathode finger density and thus to better utilization of the substrate or wafer area.

Since the device is planar in the edge area, all known methods for generating a reverse-voltage proof edge termination (trenches, guard rings, electric field plates and so forth) can be used without problems as a result of which the additional deep p-type diffusion mentioned can be omitted in many cases.

Another advantage consists in the fact that the risk of fracture is reduced because of the lack of large-area removal of the semiconductor substrate and for this reason thinner base material can be used which, at the same time, has a favorable effect on the conduction resistance ($R_{ON}$).

In addition, an anisotropic chemical wet etching technique can be particularly advantageously used in the production of a semiconductor device according to the invention whereby particularly deep trenches and thus a very favorable height-to-width ratio of the cathode fingers can be achieved.

Finally, due to the planarity the edge area of the semiconductor substrate outside the actual control zone is available for implementing other structures, particularly in the form of an MOS logic or of suitable MOS drive electronics.

The production method according to the invention inter alia includes the masked insertion of the n+-doped cathode areas into the semiconductor substrate with the subsequent anisotropic deep etching of the gate trenches, again masked,

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4 is a cross-sectional view through a gate trench along line B—B in FIG. 3;

FIG. 5A-5D are cross-sectional views showing various stages in the production of a device according to the invention;

DESCRIPTION OF THE PREFERRED EMBODIMENTS

Figure 1:
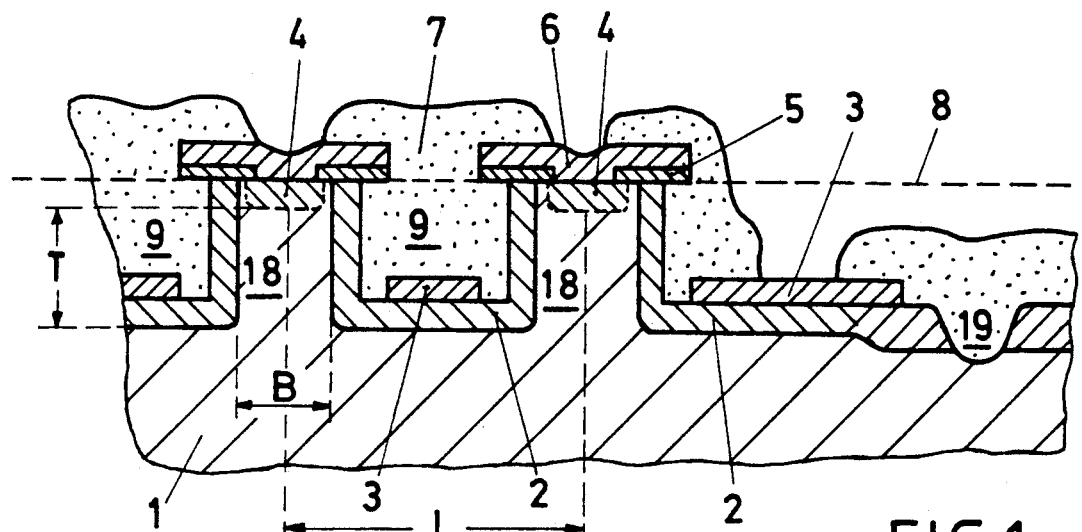
FIG. 1 is a cross-sectional view of a semiconductor device according to the prior art.

Referring now to the drawings, wheein reference numerals designate identical or corresponding parts throughout the several views, in FIG. 1, the construction of a conventional semiconductor device as known from European Patent A1-0 121 068 is shown in cross-section in a section restricted to the cathode-side structure. The case of the field-controlled thyristor (FCTh) has been selected here for the purpose of explanation. However, the explanations following similarly apply to a GTO thyristor with its slightly different sequence of layers in the semiconductor substrate.

The known semiconductor device of FIG. 1 essentially consists of a semiconductor substrate 1, mostly in the form of a thin disc which comprises the sequence of differently doped layers characteristic of the respective component. In the present case, this includes on the anode side a p-doped anode region, not shown, above which an n⁻-doped channel region is arranged (in the case of the FCTh) which extends to the cathode side and essentially is the semiconductor substrate 1 in the section of FIG. 1.

The semiconductor substrate 1, or the n⁻-doped channel region, extend to the top, that is to say towards the cathode side, in a plurality of raised cathode fingers 18 into the tops of which n+-doped cathode regions 4 are diffused.

The cathode regions 4 are contacted by metallic cathode contacts 6 which are electrically insulated from the underlying regions of the cathode fingers 18 by appropriately constructed insulating layers 5 outside the cathode regions 4.

The individual cathode fingers 18 are separated from each other by trenches which are surrounded by p-doped gate regions 2 within the semiconductor substrate 1. The gate regions 2, together with the adjoining n⁻-doped channel layer, form P-N junctions the space charge zones of which, with a suitable bias voltage, expand into the channel regions existing in the cathode fingers 18 and constrain and finally completely interrupt the current flow there.

Metallic gate contacts 3 are provided at the bottoms of the trenches so that the bias voltage can be applied. The trenches are further conventionally filled with a passivation layer 7 which even partially covers the cathode fingers 18 but leaves other areas of the cathode contacts 6 open to enable an electrical cathode connection to be made towards the outside.

The cathode fingers 18 and the intermediate gate trenches 9 and the gate contacts 3 arranged in the latter together form the control zone of the known component. The finger spacing L between the cathode fingers 18 and the size of the dimensions of the channels in the cathode fingers 18 drawn in FIG. 1, their depth T and their width B or the ratio between the two quantities are of importance for the drive characteristic of the component and for the utilization of the substrate area. The finger spacing L is also essentially determined by the relatively large width of the gate trenches which is a result of the gate contacts 3 and the cathode contacts 6 being applied in a single process step and the gate contacts 3 having to be sufficiently wide at the trench bottoms to be able to carry a sufficiently high control current.

Figure 6A:
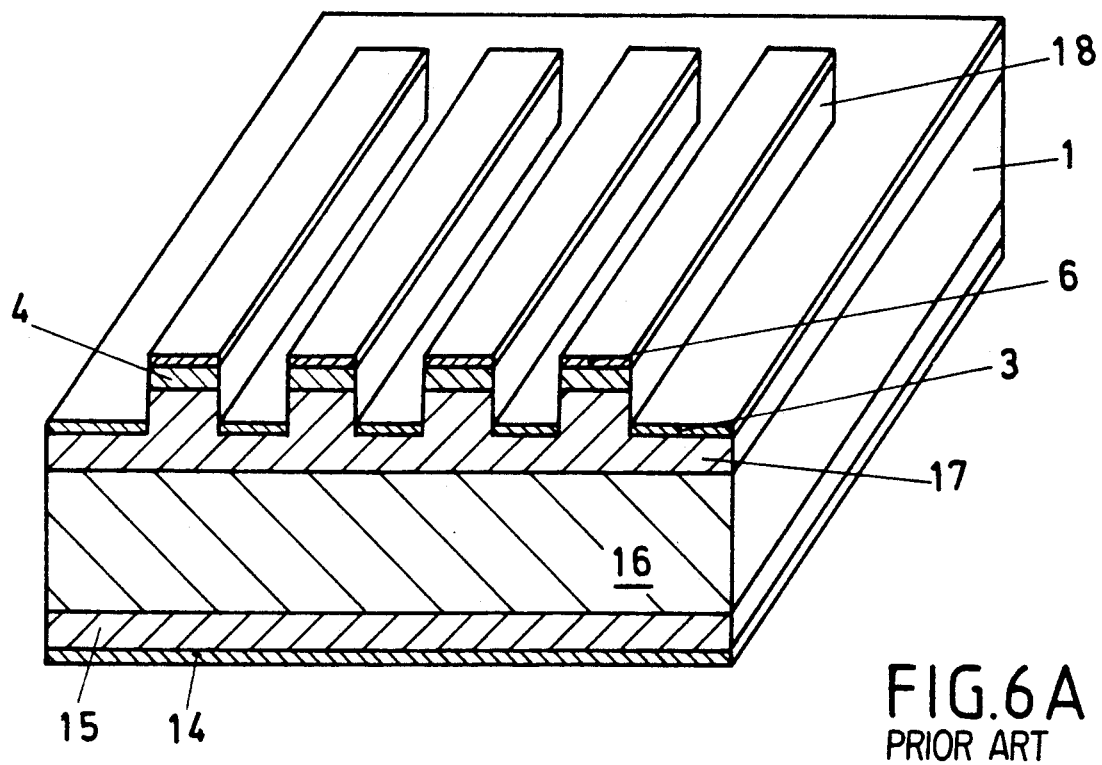
FIG. 6A is a perspective view of the cathode-side topology of a device according to the prior art.

As can be clearly seen from FIG. 1, particularly at the edge region shown on the right-hand side of the figure, the semiconductor substrate 1, excepting the cathode fingers 18, is removed from the original substrate surface 8 down to the gate plane by the deep etching process in the known component (see also the perspective view in FIG. 6A).

The P-N junction formed from the p-doped gate region 2 and the n⁻-doped channel region laterally emerges on the surface in the edge region. This surface penetration usually results in a reduction of the maximum reverse voltage at the P-N junction which must be eliminated by means of suitable measures. In the known device of FIG. 1, these measures comprise a deep selective p-type diffusion (high voltage termination 21) in the edge region (shown crosshatched in FIG. 1) and an edge trench 19 placed around at the edge and reaching into the channel region. The disadvantage here is that the deep selective p-type diffusion in the edge region cannot be effected together with the diffusion of the p-doped gate regions 2 but requires a separate process step.

Figure 2:
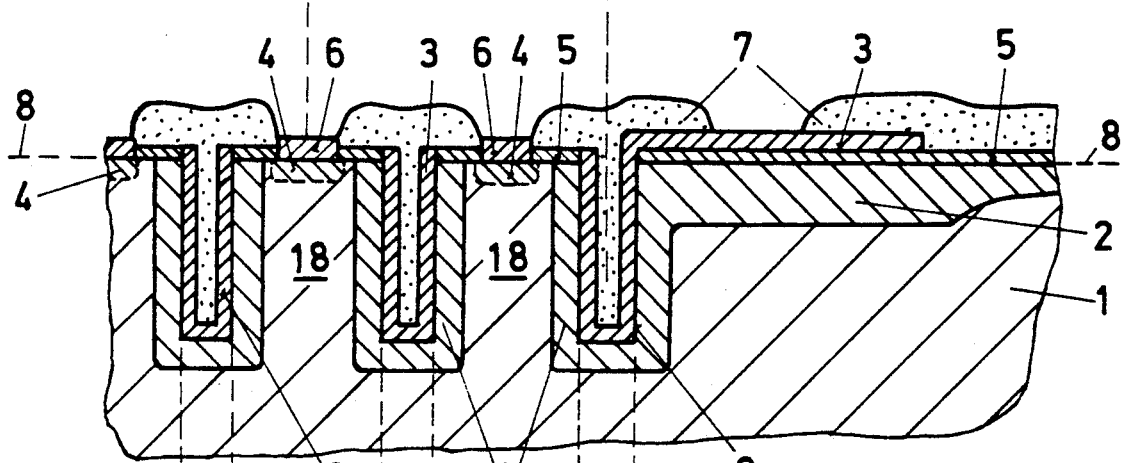
FIG. 2 is a cross-sectional view of a device according to an illustrative embodiment of the present invention.

For comparison with the known device of FIG. 1, the corresponding section from the cross-section through a semiconductor device according to the invention is reproduced in FIG. 2. Here, too, single cathode fingers 18 are provided at the cathode side which are separated from each other by gate trenches 9. Here, too, the p-doped gate regions 2, contacted by metallic gate contacts 3, extend around the gate trenches 9 in the semiconductor substrate 1 (n⁻-doped channel region in the FCTh, p-doped p base layer in the GTO). There is a high voltage termination 21 enclosing the control zone.

Apart from these commonalities, however, the differences with respect to a conventional device according to FIG. 1 are clearly apparent. Due to the different type of production method, the gate trenches 9 are constructed as narrow deep slots. The consequence of this is that, whilst the dimensions of the cathode fingers 18 remain the same, more fingers per unit length can be arranged on the substrate in the transverse direction. If, in the comparison between FIG. 1 and 2, the finger spacing L from FIG. 1 is used as a basis, 1.5 fingers could be accommodated along this length in the example of FIG. 2.

The construction according to the invention of the gate trenches 9 as deep narrow slots necessitates a special etching technique (a crystal-direction-selective chemical wet etching method is preferably used here). Further, in the embodiment of FIG. 2, there is provided technology of gate metallization in which not only the bottoms but also the side walls of the gate trenches 9 are covered with the gate contact 3 to enable corresponding gate currents to be achieved.

The other production method for a component according to the invention also leads to an altered configuration at the top of the cathode fingers 18 which is essentially expressed in narrow cathode contacts 6 and insulating layers 5 which do not overhang.

The difference in configuration of the insulating layers 5 in the conventional (FIG. 1) and the novel (FIG. 2) component gives the new component a further advantage: although the gate contacts 3 are only applied to the trench bottoms in the conventional design, the entire trench walls are at the gate potential. The insulating gap between gate potential and cathode contacts 6 therefore only consists of the overhanging regions of the insulating layers 5 (about 2-3 $\mu$m).

In contrast, the entire width of the insulating layers 5 (about 10 $\mu$m) is available as insulating gap in the novel component according to FIG. 2. In addition, the insulating layers 5 are visible towards the top and thus can be more easily visually checked during production.

However, another conspicuous difference compared with the conventional device is very significant: apart from the gate trenches 9 themselves, the original substrate surface 8 of the semiconductor substrate 1 is retained below the additional layers 5, 6, 3 and 7 above it and the component according to the invention is thus largely planar. The limited extent of the gate trenches 9 becomes particularly clear in the top view of the cathode-side surface shown in FIG. 3. Between the cathode fingers, the extent of which largely corresponds to the area of the insulating layers 5 and the cathode contact 6, the metallized gate trenches 9 are arranged which only slightly project in length past the areas of the cathode fingers. The passivation layer 7 from FIG. 2 is naturally not drawn in the representation of FIG. 3 in order to obtain an unambiguous picture of the lateral dimensions of the individual regions.

Figure 3:
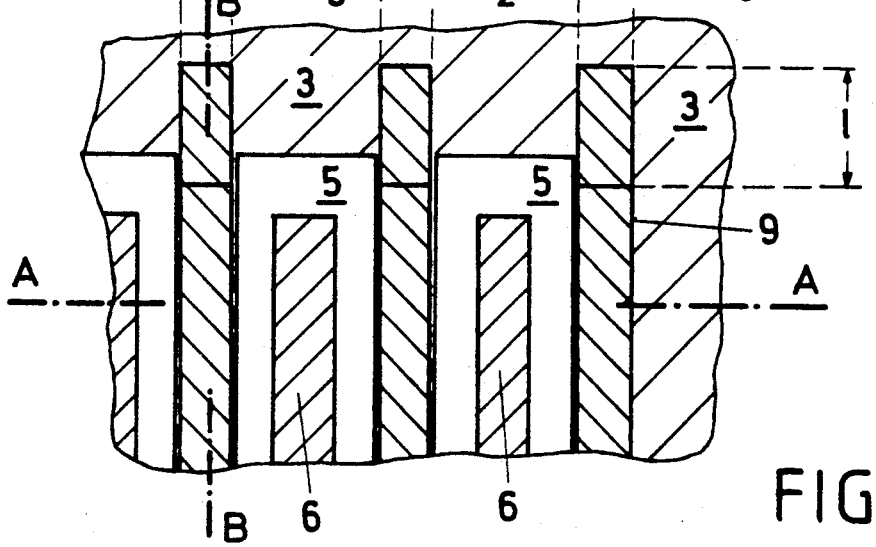
FIG. 3 is a top view of the device according to FIG. 2, in cross-section.

FIG. 2 otherwise shows a section along line A—A in FIG. 3. The section line B—B perpendicular thereto relates to the representation of FIG. 4 explained in the text which follows.

This FIG. 4 shows a cross section along line B—B from FIG. 3 through one of the gate trenches 9. The semiconductor substrate 1 can be seen at the bottom with the recessed gate trench 9 which reveals the side wall of the trench or of the adjacent cathode finger, respectively, the longitudinal extent of which is indicated by the cathode contact 6 resting on it.

The gate trench has between the cathode fingers a flat trench bottom which rises obliquely upwards to the substrate surface 8 along a length of end section 1 (which is also drawn in FIG. 3) at the end of the trench. This inclination at the trench end is produced when the gate trenches 9, in accordance with a preferred method, are directionally selectively wet chemically etched out of a Si semiconductor substrate having a particular crystal orientation (surface in direction 110; trenches along direction 111).

In addition to the passivation layer 7, already known from FIG. 1 and 2, FIG. 4 additionally shows a metallization layer 13 which partially covers the passivation layer 7 and partially the cathode contacts 6 and is used for the cathode-side contacting of the finished component.

In addition to the special "quasi-planar" topology, it is especially also the geometric dimensions of the individual elements (gate trenches, cathode fingers, channel) in the control zone which are of significance for the novel device. A distinction must be made between the two cases where the device can have the structure of a GTO thyristor or of a FCTh.

In the case of the field-controlled thyristor FCTh, it is especially the so-called "aspect ratio", that is to say the ratio between depth T and width B of the channels in the cathode fingers 18 (both quantities are drawn in in FIG. 1) which plays a big role for the drive characteristic. According to an illustrative embodiment of the invention, this ratio is within a range of $T/B=0.5$ to $T/B=10$. A ratio between 1 and 2 is particularly preferred. The cathode fingers 18 themselves have a width of between 5 and 500 $\mu$m, a width of 20 $\mu$m being preferred. The gate trenches 9, finally, have a width range of from 5 to 500 $\mu$m just like the cathode fingers 18. However, the gate trenches are preferably constructed as slots with a width of only about 10 $\mu$m.

In the case of the GTO thyristor, the above-mentioned "aspect ratio" is of much lesser importance because the turn-off is not effected by constraining a channel in this case. For the GTO, the dimensions of the gate trenches 9 should be such that their depth is greater than 5 $\mu$m but less than the depth of the p base layer inserted into the semiconductor substrate. The depth is preferred to be about 20 $\mu$m. The width of the gate trenches is again within a range of between 5 $\mu$m and 500 $\mu$m, preferably about 10 $\mu$m. As in the FCTh, the cathode fingers 18 have a width of between 5 $\mu$m and 500 $\mu$m, in particular about 50 $\mu$m.

The doping concentrations in the individual semiconductor layers of the new component can be found in the data supplied in European Patent 0 121 068.

As has already been mentioned, the method for producing the novel component is of particular importance because of the special design of the gate trenches. Individual stages of the production method comprising a plurality of process steps are shown in cross sections through the semiconductor substrate processed in FIG. 5A-5D explained in the text which follows.

The starting point is a planar semiconductor substrate disc the internal sequence of differently doped layers of which has already been generated by preceding diffusion or implantation steps. This particularly applies to any p-doped edge layer 20 (FIG. 5A) which is inserted into the substrate by deep diffusion before further structuring steps are undertaken on the cathode-side substrate surface and which is of importance for the case where a trench is used as edge termination of the P-N junction.

A continuous mask layer, preferably of SiO$_2$ is next applied to the substrate prepared in this manner. This mask layer is then selectively removed by etching in the regions of the later cathode contacts, thus producing a mask. The n+-doped cathode regions 4 (FIG. 5A) are then produced by diffusion or implantation into the semiconductor substrate 1 through the etched-out windows of this mask.

This is followed by covering the mask layer and its windows with an etching-resistant mask, excepting the regions of the later gate trenches. The intermediate stage of the semiconductor substrate achieved in this manner is shown in section in FIG. 5A. The semiconductor substrate 1 can be seen with the p-doped edge layer 20 arranged at the edge, with the n+-doped cathode regions 4 diffused in, with the $SiO_2$ mask layer used for this diffusion which is already designated as insulating layer 5 because of its later function, and the structured etching mask 10 which has windows for the subsequent deep etching of the gate trenches.

The anisotropic deep etching of the gate trenches can be achieved, for example, in known manner by reactive ion etching (RIE) without taking into consideration the crystal orientation of the monocrystalline semiconductor substrate. The above-mentioned etching-resistant mask then preferably has the form of an aluminum layer. However, a crystal direction selective chemical wet etching method is preferably used such as is known from the article by D. L. Kendall, Appl. Phys. Lett. 26, No. 4 (1975), page 195 ff. In this case, the etching-resistant mask suitably consists of $SiO_2$ which is formed by new oxidization or is deposited by means of a known CVD (Chemical Vapor Deposition) method.

The starting point for this wet chemical etching method is a monocrystalline Si semiconductor substrate which is oriented in crystal direction 110 with the surface exposed to the etching attack (in this case the cathode-side surface). If then the gate trenches to be etched are furthermore aligned in parallel with the crystal direction 111 in their longitudinal direction, extremely narrow and deep slot-shaped trenches can be excavated such as can be used as gate trenches with particular advantage in the component according to the invention.

Etching with a 44% KOH solution at a temperature of about 80° C., at which etching rates of about 2 μm/min are achieved, has been found to be advantageous.

After the completed wet chemical etching of the gate trenches or slots through the windows of the etching mask 10, the p-doped gate regions 2 are inserted, for example by masked boron diffusion, into the semiconductor substrate 1 from the gate trenches 9 (FIG. 5B). In the edge region, the gate regions 2 pass into the already existing edge layer 20 which is also p-doped.

As the next step, a continuous metallization over the whole area of the cathode-side surface of the semiconductor substrate follows. This metallization is preferably achieved by spattering on aluminum or nickel. If required, this first metallization layer 12 (FIG. 5C) can be galvanically reinforced. This galvanic reinforcing can even extend to the gate trenches 9 being completely filled with metal.

The continuous first metallization layer 12 must then be interrupted at suitable places to separate cathode and gate contacts from each other. For this purpose, an etching mask 11 of photoresist is applied as shown in FIG. 5C, the windows of which are in each case arranged between the edges of the adjacent gate trenches and the later cathode contacts 6 (FIG. 5D). The first metallization layer 12 is etched away through the windows at the places located there. The surface of the structure is then covered with an insulating passivation layer 7, leaving out the cathode contacts 6 (FIG. 5D). The end stage of the method, shown in FIG. 5D, is reached by a second metallization layer 13 being applied above the passivation layer 7 and the cathode contacts 6 by the so-called "overlay" technique. This second metallization layer 13 which can consist, for example, of a sequence of Cr/Ni/Au metal layers, is electrically insulated from the first metallization layer (12 in FIG. 5C), which is now split into the cathode contacts 6 and the gate contacts 3, by the intermediate passivation layer 7 outside the cathode contacts 6. However, the layer 13 is conductively connected to the cathode contacts 6 and thus creates the possibility of large-area cathode contacting.

The passivation layer 7 preferably consists of a polyimide or an anorganic dielectric (for example $SiO_2$) which can be applied by means of a low-temperature CVD method.

Another preferred embodiment of the production method comprises the following steps:
the prediffused semiconductor substrate 1 is first oxidized on the surface;
in the $SiO_2$ layer produced, the windows are opened above the later gate trenches 9;
the gate trenches or slots are etched out (wet chemically by the KOH solution already mentioned);
boron is diffused in for forming the gate regions 2;
the substrate is masked with photoresist, excepting the regions of the later cathode contacts 6;
the oxide layer is etched away in the regions not masked; and
the cathode regions 4 are formed (for example by implantation of phosphorus).

In this embodiment, therefore, it is especially the order of the steps of trench etching and of forming the cathode regions which is exchanged compared with the method previously described.

The novel device produced by this method differs from the conventional component especially in the cathode-side topology. In order to present these differences again particularly clearly, the conventional (FIG. 6A) and the novel (FIG. 6B) component are again compared with each other in a perspective view in FIG. 6A and 6B.

FIG. 6A is based on the GTO version which has an anode contact 14, a p-doped anode layer 15, an n base layer 16 and a p base layer 17 in the semiconductor substrate 1.

Figure 6B:
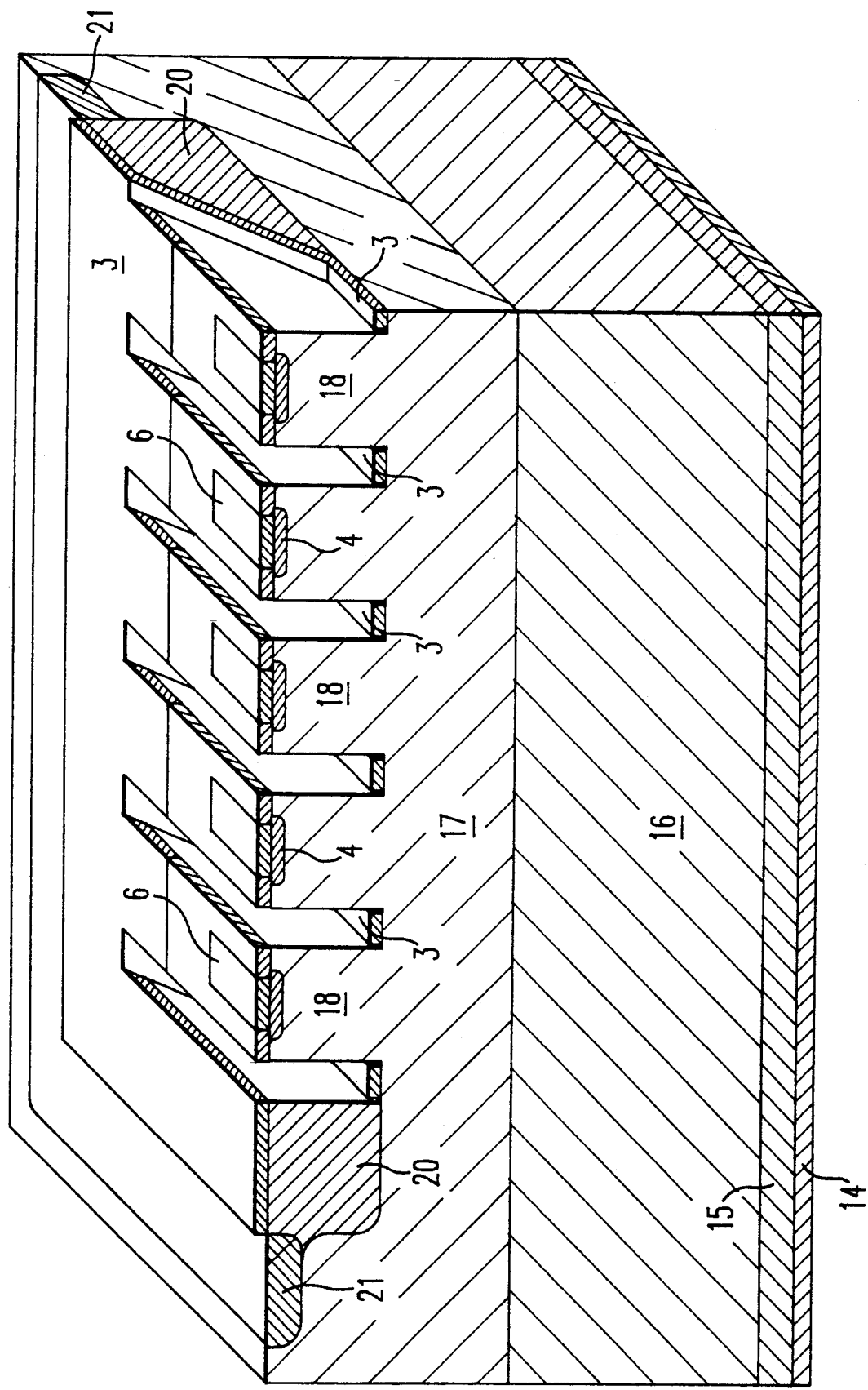
FIG. 6B is a perspective view of the cathode-side topology of a device according to the invention.

In FIG. 6B, in contrast, the details relating to the electrodes, particularly in the control zone have been simplified so that clarity of representation is not impaired.

When the two views are compared, the quasi planarity of the novel device compared with the two-plane structure of the conventional device becomes conspicuous.

Figure 7:
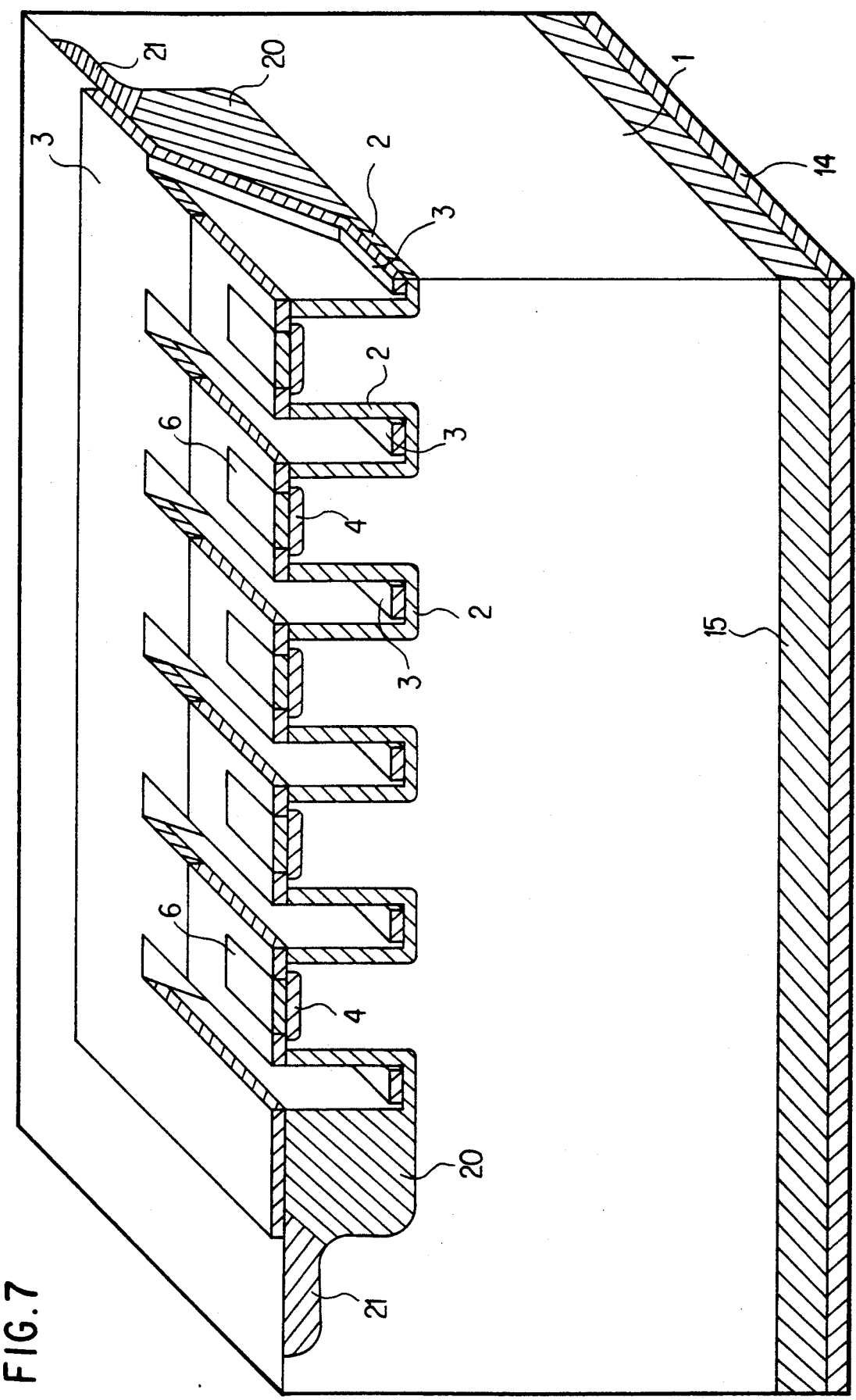
FIG. 7 is a perspective cross-sectional view of a preferred embodiment exhibiting a deep p-doped edge layer.

FIG. 7 illustrates another preferred embodiment of the invention. Accordingly, the deep p-doped edge layer 20 has about the same depth as the p-doped gate layer 2 inserted into the bottom of the gate trenches (wherein in each case the depth is measured with respect to the retained surface). In other words, the gate layer 2 smoothly goes into the edge layer 20 at the outskirts of the whole control zone. This avoids the sharp edges of the pn-junction formed by the n-doped semiconductor substrate 1 and the gate layer 2. It is important for such an embodiment, that the p-doped edge layer 20 entirely surround the gate region, i.e., all gate trenches be enclosed by the deep diffusion layer 20. In the area of the deep edge layer 20 the semiconductor substrate has a flat, retained surface.

The p-doped edge layer 20 has a doping concentration that is higher than that of the p-type gate region 2 and that of a high voltage termination 21.

The contact to the gate layer 2 inserted into the bottoms of narrow gate trenches is made by the gate contact 3, which is a metallization layer covering the bottoms and the slanted ends of the gate slots as well as a part of the retained surface 8 of the substrate. The part of the gate metallization which is on top of the original surface 8 provides a contact area for an external gate electrode (not shown in FIG. 7). The vertical side walls of the gate trenches are not covered by any metallization. Because the vertical side walls are free from a conducting layer, the problem of electrical bypass (for holes) is eliminated altogether.

Overall, the invention provides a novel device which is distinguished by better utilization of the area, simplified edge termination, possibilities for integrating further components in the edge region, higher mechanical strength and greater ease of manufacture.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A gate-controlled high-power capability bipolar semiconductor device with minority carrier injection, comprising:
    an anode side and a cathode side opposite said anode side;
    a semiconductor substrate with a surface oriented in a first predetermined crystal direction on the cathode side;
    in the semiconductor substrate a p-doped anode region on the anode side and a plurality of n-doped cathode regions arranged on the tops of strip-shaped cathode fingers on the cathode side;
    a control zone which acts as a gate and which includes the plurality of strip-shaped cathode fingers and gate trenches provided on said surface, wherein said cathode fingers are separated from each other by said gate trenches arranged between the cathode fingers and extending into the substrate;
    metallic cathode contacts contacting the cathode regions;
    gate contacts provided in the gate trenches for controlling the device;
    said gate trenches being narrow deep slots which are limited in their extent to the region of the control zone with the surface of the substrate outside the control zone being retained, so that except for the gate trenches the surface of the substrate is substantially planar;
    said gate trenches essentially extending along a second predetermined crystal direction and have long vertical side walls in the second crystal direction and short inclined side walls at the trench ends such that at the end the gate trenches rise obliquely upwards from a flat trench bottom to the surface of the substrate; and
    said gate contacts not only covering the bottom but also the inclined side walls at the trench ends providing the contact for controlling the device.

2. A semiconductor device as claimed in claim 1, wherein: said first and second predetermined crystal directions are (110) and (111), respectively.

3. A gate-controlled high-power capability bipolar semiconductor device with minority carrier injection, comprising:
    an anode side and a cathode side opposite said anode side;
    a semiconductor substrate with a surface oriented in a first predetermined crystal direction on the cathode side;
    in the semiconductor substrate a p-doped anode region on the anode side and a plurality of n-doped cathode regions arranged on the tops of strip-shaped cathode fingers on the cathode side;
    a control zone which acts as a gate and which includes the plurality of strip-shaped cathode fingers and gate trenches provided on said surface, wherein said cathode fingers are separated from each other by said gate trenches arranged between the cathode fingers and extending into the substrate;
    metallic cathode contacts contacting the cathode regions;
    gate contacts provided in the gate trenches for controlling the device;
    said gate trenches being narrow deep slots which are limited in their extent to the region of the control zone with the surface of the substrate outside the control zone being retained, so that except for the gate trenches the surface of the substrate is substantially planar;
    said gate trenches essentially extending along a second predetermined crystal direction and have long vertical side walls in the second crystal direction and short inclined side walls at the trench ends such that at the ends the gate trenches rise obliquely upwards from a flat trench bottom to the surface of the substrate; and
    said gate contacts not only covering the bottoms but also the inclined side walls at the trench ends providing the contact for controlling the device;
    p-doped gate regions extending around the gate trenches; and
    a p-doped edge layer provided at said surface as edge termination of the control zone.

4. A semiconductor device as claimed in claim 3, comprising:
    said p-doped edge layer having the same depth as the p-doped gate regions inserted into the bottoms of the gate trenches, wherein in each case the depth is measured with respect to the retained surface; and
    said p-doped edge layer having a concentration that is higher than that of the p-type gate regions.

5. A semiconductor device as claimed in claim 4, further comprising:
    a high voltage termination separated from said control zone by said p-doped edge layer and having a doping concentration less than that of said p-doped edge layer.

6. A semiconductor device as claimed in claim 3, wherein:
    the substrate contains an n-doped channel layer forming PN junctions with the p-doped gate regions.

7. A semiconductor device as claimed in claim 3, wherein:
    the substrate contains a p-doped p base layer between the gate trenches.

8. A semiconductor device as claimed in claim 3, wherein:
    only the inclined side walls, and not the vertical walls of the gate trenches are covered with the gate contacts.

9. A semiconductor device as claimed in claim 3, wherein: said first and second predetermined crystal directions are (110) and (111), respectively.

* * * * *